United States Patent [19]

Maringer

[11] 4,041,373
[45] Aug. 9, 1977

[54] CAPACITIVE PULSE PICKUP

[75] Inventor: Albert Maringer, Karlsruhe, Germany

[73] Assignee: Siemens Aktiengesellschaft, Munich, Germany

[21] Appl. No.: 650,727

[22] Filed: Jan. 20, 1976

[30] Foreign Application Priority Data

Jan. 23, 1975 Germany .............................. 2502715

[51] Int. Cl.² .................................................. G01R 13/42
[52] U.S. Cl. .................................. 324/15; 324/72.5; 324/126; 324/133
[58] Field of Search ............. 324/15, 16 R, 165, 16 T, 324/17, 18, 19, 72.5, 126, 127, 133, 149

[56] References Cited

U.S. PATENT DOCUMENTS

| 1,724,195 | 8/1929 | Hantzsch | 324/17 |
| 2,323,931 | 7/1943 | Peters | 324/18 |
| 3,513,394 | 5/1970 | Tachick | 324/133 |
| 3,524,133 | 8/1970 | Arndt | 324/133 X |
| 3,524,178 | 8/1970 | Stratton | 324/133 X |
| 3,743,922 | 7/1973 | Festos | 324/16 R X |
| 3,970,932 | 7/1976 | Harvey | 324/133 |

*Primary Examiner*—Stanley T. Krawczewicz
*Attorney, Agent, or Firm*—Kenyon & Kenyon, Reilly, Carr & Chapin

[57] ABSTRACT

A capacitive pulse pickup is disclosed. The pickup comprises a capacitor electrode which is adapted to be placed against an ignition cable or the like and is directly connected with one end of the primary winding of a pulse transformer, the other end of the primary winding being grounded. The secondary winding of the transformer is, in turn, connected, via a two-conductor cable, to a pulse processing circuit.

7 Claims, 3 Drawing Figures

CAPACITIVE PULSE PICKUP

BACKGROUND OF THE INVENTION

1. Field of the Invention

The invention relates to a capacitive pulse pickup having a capacitor electrode which is adapted to be placed against an ignition cable or the like.

2. Description of the Prior Art

Pulse pickups of the above type are known from U.S. Pat. No. 3,474,667. These pickups are inexpensive to manufacture, are rugged and easy to handle. However, they have one disadvantage which often leads to measurement errors. In particular, it is found that the capacitive pickups respond not only to voltage changes in their immediate vicinity, but also to voltage changes in their farther removed surrounding environment. As a result, faulty pulses are generated which lead to erroneous results.

In U.S. Pat. No. 3,543,572, for example, there are also described inductive type pulse probes or pickups which are less sensitive to undesired stray influences. When an inductive probe is used for picking up the ignition pulses of an ignition system of an externally fired internal-combustion engine, operation of the probe depends upon the charging current of the charging circuit of the ignition system, as the firing current proper of the ignition spark has no pulse-like rise. The charging current, however, depends on the total capacity of the ignition system which has a different magnitude for each type of motor vehicle. It is, therefore, difficult to design a single inductive probe for all ignition systems.

It is an object of the present invention to provide an improved capacitive pulse pickup.

SUMMARY OF THE INVENTION

In accordance with the principles of the present invention, the above and other objectives are accomplished by a capacitive pulse pickup comprising a capacitor electrode which is connected directly to one end of the primary winding of a pulse transformer, the other end of the primary winding being grounded. The secondary winding of the pulse transformer, in turn, is connected, via a two-conductor cable, to a pulse processing circuit.

With the capacitive pulse pickup designed as aforesaid, it is found to be much less sensitive to stray fields than the above-described prior art pickups, since the capacitor electrode of the pickup has only a small capacity with respect to interference sources. Moreover, the cable leading away from it has two conductors, so that capacitive stray fields produce in the cable only signals of a common mode type which can easily be eliminated in the pulse processing circuit. Furthermore, since the pickup is a capacitive pickup, it has none of the already mentioned shortcomings of inductive pickups. In addition, it is not necessary, as in some prior art inductive pickups, to split the core of the magnetic component of the present pickup and to design it as a clamp-on holder.

Advantageously, the capacitor electrode and the pulse transformer of the present pickup are encapsulated with a common plastic encapsulation. Also, advantageously, the two-conductor cable is provided with a shield which is grounded.

The capacitor electrode may be designed in the form of a laminar conductor which itself advantageously forms the aforesaid one end of the primary winding of the pulse transformer.

BRIEF DESCRIPTION OF THE DRAWINGS

The above and other features and aspects of the present invention will become more apparent upon reading the following detailed description in conjunction with the accompanying drawings, in which.

DETAILED DESCRIPTION

Figure 1:
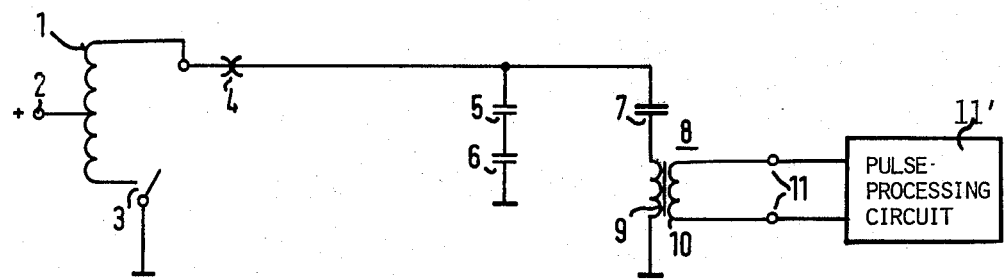
FIG. 1 shows the basic circuit diagram of an ignition system which is being monitored by a capacitive pulse pickup in accord with the invention.

FIG. 1 shows the ignition coil 1 of an ignition system of an internal-combustion engine with external ignition. As illustrated, the ignition coil is in the form of an autotransformer. A tap 2 taken from coil 1 is connected to the plus pole of a battery. The lower end of the ignition coil 1 can be connected, via an interrupter contact 3, with the other pole of the battery which is shown as ground. The upper end of the ignition coil 1, which carries high voltage if the interrupter contact 3 opens and closes, is connected through an ignition distributor contact 4, which is provided in multiple in multicylinder engines, and through a series spark gap 5, shown as a capacitor, to the spark gap 6, also shown as a capacitor, of a spark plug. The second electrode of the spark plug gap is also connected to ground.

To monitor the ignition system, a capacitive pulse pickup in accordance with the invention is provided comprising a capacitor electrode 7 and a pluse transformer 8. The pulse transformer 8 has a primary winding 9 and a secondary winding 10. One end of the primary winding 9 is connected directly with the capacitor electrode 7, and the other end of the primary winding 9 is connected to ground. The ends of the secondary winding 10 are connected to a two-conductor cable 11 which leads to a pulse processing circuit 11'. In operation, the capacitor electrode 7 of the capacitive pulse pickup is attached at some insulated point of the parts of the ignition system which carry high voltage during the ignition process. The conductor section of the ignition system opposite the capacitor electrode 17 i.e., on the other side of the insulating layer to which the electrode 7 is attached, then serves as the second electrode of the measuring capacitor of the pickup.

The capacitor electrode 7, advantageously, has an area in the order of magnitude of 5 × 5 mm. The pulse transformer 8 may be a simple ferrite ring core of about 5 mm diameter, on which several turns are arranged as the primary and secondary windings 9 and 10, respectively.

Figure 2:
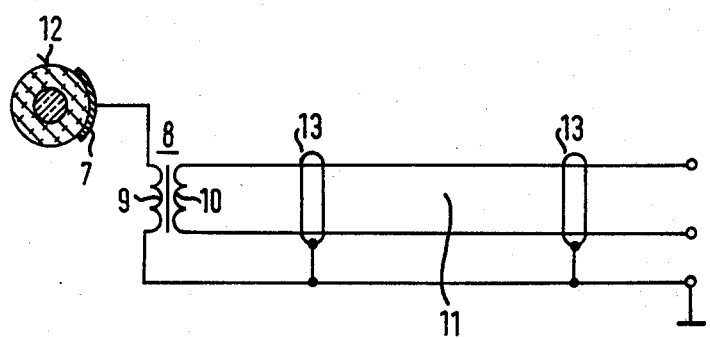
FIG. 2 shows a wiring diagram of a capacitive pulse pickup in accord with the invention.

In FIG. 2, the capacitor electrode 7 is adapted to have a curvature which fits the circumference of the cable 12 of the ignition system at the point of attachment. Moreover, the lower end of the primary winding 9 of the pulse transformer 8 is connected to ground via a grounded shield 13 provided for the two-conductor measuring cable 11.

Figure 3:
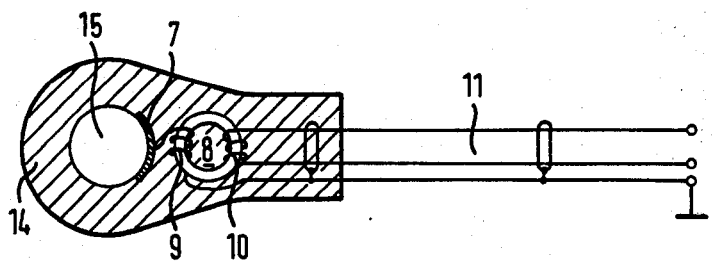
FIG. 3 illustrates a cross section of the head of a probe in accord with the invention.

FIG. 3 shows the pulse transformer 8 and the capacitor electrode 7, as well as the connection of the cable 11 on the transformer side, combined into a pickup head which is provided with plastic encapsulation 14. As shown, the pickup head has a hole 15, through which the ignition cable is pushed. Alternatively, the plastic encapsulation can also be made as a clamp-like structure in which all parts belonging to the pulse pickup are combined in one-half of the clamp, so that no movable contacts or the like are necessary.

What is claimed is:

1. A capacitive pulse pickup for use with an ignition cable having a conductor therein, said pickup comprising:
   capacitive electrode means for placement in contact with said ignition cable so as to be subject to voltage influences other than the voltage on the conductor of said cable, said electrode means forming with the conductor of said cable a capacitor, whereby said electrode detects the voltage on said conductor;
   a pulse transformer comprising primary and secondary windings, said primary winding having one end directly connected to said electrode means and its other end grounded, and said secondary winding providing an output related to said voltage detected by said electrode means.

2. A capacitive pulse pickup in accordance with claim 1 further comprising:
   a pulse processing circuit;
   and a two-conductor cable for connecting said pulse processing circuit to said secondary winding.

3. A capacitive pulse pickup in accordance with claim 2 in which said two-conductor cable includes a shield adapted to be grounded.

4. A capacitive pulse pickup in accordance with claim 1 further comprising:
   common plastic encapsulation for encapsulating said electrode means and said pulse transformer.

5. A capacitive pulse pickup in accordance with claim 1 in which said electrode means is a laminar conductor.

6. A capacitive pulse pickup in accordance with claim 1 in which said capacitive electrode means is formed by said one end of said primary winding.

7. A capacitive pulse pickup in accordance with claim 1 in which said shield is connected to said other end of said primary winding.

* * * * *